US011637000B2

(12) United States Patent
Krassnitzer et al.

(10) Patent No.: US 11,637,000 B2
(45) Date of Patent: Apr. 25, 2023

(54) COATING DEVICE FOR CONDUCTING HIGH EFFICIENT LOW TEMPERATURE COATING

(71) Applicant: Oerlikon Surface Solutions AG, Pfäffikon, Pfäffikon (CH)

(72) Inventors: Siegfried Krassnitzer, Feldkirch (AT); Sebastien Guimond, St. Gallen (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 211 days.

(21) Appl. No.: 16/636,290

(22) PCT Filed: Aug. 2, 2018

(86) PCT No.: PCT/EP2018/071028
§ 371 (c)(1),
(2) Date: Feb. 3, 2020

(87) PCT Pub. No.: WO2019/025559
PCT Pub. Date: Feb. 7, 2019

(65) Prior Publication Data
US 2020/0194236 A1 Jun. 18, 2020

(30) Foreign Application Priority Data
Aug. 2, 2017 (CH) ..................................... 00993/17

(51) Int. Cl.
*H01J 37/32* (2006.01)
*C23C 14/32* (2006.01)
(Continued)

(52) U.S. Cl.
CPC ...... *H01J 37/32522* (2013.01); *C23C 14/325* (2013.01); *C23C 14/35* (2013.01);
(Continued)

(58) Field of Classification Search
None
See application file for complete search history.

(56) References Cited

U.S. PATENT DOCUMENTS

| 5,769,158 A | * | 6/1998 | Yao | F28F 13/00 165/185 |
| 5,891,350 A | * | 4/1999 | Shan | H01J 37/32834 216/71 |
| 6,190,513 B1 | * | 2/2001 | Forster | H01J 37/321 204/192.12 |

(Continued)

FOREIGN PATENT DOCUMENTS

| CN | 102465260 A | 5/2012 |
| DE | 19958643 C1 | 5/2001 |

(Continued)

*Primary Examiner* — Jason Berman

(57) ABSTRACT

The present invention relates to a coating device comprising a vacuum coating chamber for conducting vacuum coating processes, said vacuum coating chamber comprising: —one or more cooled chamber walls 1 having an inner side 1 b and a cooled side 1 a, —protection shields being arranged in the interior of the chamber as one or more removable shielding plates 2, which cover at least part of the surface of the inner side 1 b of the one or more cooled chamber walls 1, wherein at least one removable shielding plate 2 is placed forming a gap 8 in relation to the surface of the inner side 1 b of the cooled chamber wall 1 that is covered by said removable shielding plate 2, wherein: —thermal conductive means 9 are arranged filling the gap 8 in an extension corresponding to at least a portion of the total surface of the inner side 1 b of the cooled chamber wall 1 that is covered by said removable shielding plate 2, wherein the thermal conductive means 9 enable conductive heat transfer between said removable shielding plate 2 and the respectively covered cooled chamber wall 1.

16 Claims, 5 Drawing Sheets

(51) Int. Cl.
*C23C 14/35* (2006.01)
*C23C 14/54* (2006.01)
*C23C 16/27* (2006.01)
*C23C 16/44* (2006.01)
*C23C 16/46* (2006.01)
*H01J 37/34* (2006.01)

(52) U.S. Cl.
CPC ............ *C23C 14/541* (2013.01); *C23C 16/27* (2013.01); *C23C 16/4411* (2013.01); *C23C 16/463* (2013.01); *H01J 37/32477* (2013.01); *H01J 37/32651* (2013.01); *H01J 37/3405* (2013.01); *H01J 2237/002* (2013.01); *H01J 2237/3321* (2013.01)

(56) References Cited

U.S. PATENT DOCUMENTS

| | | | |
|---|---|---|---|
| 2003/0021895 A1 | 1/2003 | Ramm | |
| 2003/0057087 A1 | 3/2003 | Jung | |
| 2005/0039679 A1* | 2/2005 | Kleshock | H01J 37/32477 118/715 |
| 2005/0147742 A1* | 7/2005 | Kleshock | H01J 37/32477 427/110 |
| 2018/0265968 A1* | 9/2018 | Vetter | C23C 14/541 |

FOREIGN PATENT DOCUMENTS

| | | |
|---|---|---|
| EP | 2330232 A1 | 6/2011 |
| WO | 0056127 A1 | 9/2000 |
| WO | 2016116383 A1 | 7/2016 |
| WO | 2016116384 A1 | 7/2016 |

\* cited by examiner

COATING DEVICE FOR CONDUCTING HIGH EFFICIENT LOW TEMPERATURE COATING

The present invention relates to a coating device having an arrangement which allows increasing heat dissipation from the interior of the coating chamber to the exterior in such a manner that high efficient low temperature coating processes can be conducted.

STATE OF THE ART

Vacuum chambers used as vacuum coating chambers for conducting vacuum coating processes are usually provided with removable protection shields, which are disposed covering interior surfaces of the walls of the vacuum coating chamber, so that these shields can protect the covered interior surfaces of being unintentionally coated during coating processes.

When interior surfaces of the coating chamber walls are unavoidably coated during coating processes, accumulation of coating layers can occur, and the coating quality of the coated products being produced under these conditions can be affected. This can happen for example, because of coating contamination caused by uncontrolled delamination of the accumulated coating layers. It is also possible that insufficient coating properties result from undesirable alterations of the conditions during coating process, which can be caused for example by arcs that result from accumulation of coating layers made of nonconductive material.

The use of such kind of protection shields involves clear advantages. Main advantage is that surfaces of the protection shield are coated instead of interior surfaces of the coating chamber walls. In doing so, it is possible to take out the protection shields from the coating chamber after one or more coating processes and to remove coating layers deposited on the protection shields surfaces in an easy manner, e.g. by using known chemical or mechanical stripping processes, such as sandblasting.

FIG. 1 shows a conventional vacuum chamber (1), which is used as vacuum coating chamber comprising such protection shields and being designed for conducting coating processes.

Typical vacuum coating technologies being used for conducting coating processes are for example Physical Vapor Deposition (PVD) technologies (e.g. Magnetron Sputtering (MS), High Power Impulse Magnetron Sputtering (HiPIMS)—also referred to as High Power Pulsed Magnetron Sputtering (HPPMS), and Arc evaporation (ARC)) as well as Plasma Enhanced Chemical Vapor Deposition (PECVD) technologies—also referred to as Plasma Assisted Chemical Deposition (PACVD) technologies, only to name some of the most commonly used vacuum coating technologies. These kinds of technologies usually deliver some specific heat load to the substrate or substrates to be coated. This specific heat load depends basically on plasma properties and deposition rate.

Since all these above mentioned vacuum coating technologies take place at pressure ranges of typically 0.1 Pa to 10 Pa, the main mechanisms for heat dissipation from the one or more substrates to be coated to other surfaces or bodies placed within the chamber is limited by thermal radiation.

The vacuum coating chamber in FIG. 1 comprises chamber walls 1 having an external side that is water-cooled for regulating process temperature. This vacuum coating chamber comprises furthermore protection shields configured as shielding plates 2 that are provided in the interior of the vacuum coating chamber for covering surfaces of the inner side 1b of the chamber walls 1. The shielding plates 2 are disposed in the chamber being removable in order to make possible to take them out of the chamber and to perform sandblasting processes for removing coating layers that were deposited on the shielding plates 2 during coating processes.

The shielding plates 2 were placed forming a gap 8 in relation to the inner surface 1b of the chamber walls 1.

The space comprised within this gap is under vacuum during coating process. Thereby the pressure may usually vary between extremely high vacuum ($<1\times10^{-10}$ Pa) and 10 Pa. Therefore, heat exchange is mostly possible by radiation. For this reason, a major role regarding heat exchange within this space is played by the emissivity properties of the radiating surfaces involved.

No radiation heaters are drawn in FIG. 1, however the vacuum coating chamber can also comprise one or more radiation heaters, which can be used as heat sources for introducing heat within the chamber in order to heat the substrates 3 to be coated.

The coating chamber in FIG. 1 can comprise for example one or more coating sources 4. The coating sources can be for example arc evaporation sources or magnetron sputtering sources or any other kind of source of material to be used for forming the coating. This material is normally evaporated or sputtered or activated in such a manner for carrying out the coating process, that a plasma comprising ions of the material or comprising ions of at least some components of the material is generated. In doing so heat is produced and dissipated into the coating chamber.

It is important to take into consideration that the heat produced in this manner can be transferred directly to the substrates placed in the chamber to be coated, but also to the shielding plates 2.

Apart from the heat flows mentioned above, which are generated by the coating sources 4 and the heating radiators, also an additional heat flow can be generated by the application of a so-called bias voltage by using a bias voltage source 5.

A bias voltage is usually an at least predominantly negative voltage that is usually applied to substrates to be coated, in order to increase the difference of potential between the above-mentioned coating source plasma and the substrate to be coated, thereby causing acceleration of positively charged ions comprised in the plasma to the substrate surface to be coated.

This bias voltage can be applied to the substrate for example as a constant DC voltage signal or a pulsed DC voltage signal or a bipolar pulse DC voltage signal provided by a power supply.

In the above-mentioned case, for analyzing the thermal balance between the interior and exterior of the coating chamber, it would be necessary basically to take into consideration at least following aspects:

In any case the current drawn from the plasma in the coating chamber multiplied by the bias voltage is dissipated as heat directly on the substrate surface. In steady state, an equilibrium between inputs of heat flow and outputs of heat flow is attained:

Inputs correspond to heat flows entering in the thermal balance area (in this case: thermal balance area=coating chamber), e.g.:

heat flow being dissipated by the one or more plasmas produced by the one or more coating sources, heat flow being produced by applying the bias voltage at the one or more substrates to be coated, heat flow being produced by one or more heaters (e.g. radiation heaters)

outputs correspond to heat flows exiting from the thermal balance area, e.g.:

heat flow being dissipated from the interior of the coating chamber to the cooling water.

Furthermore, for analyzing the thermal balance within the coating chamber, in order to calculate for example the heat flow that is transferred to the coating chamber walls 1, it would be necessary to take into consideration also the heat exchange, in particular, the radiative heat exchange between the different bodies placed within the coating chamber, in this case they would be basically the coating sources, the radiation heaters, the substrates to be coated, the shielding plates 2 and the water cooled walls 1.

Substrates comprising or being made of temperature sensitive materials must be coated at especially low process temperatures. In these cases, the substrate temperature during process must be maintained under a limit temperature, above which damages of the substrate material properties can be caused.

Likewise, there are some coating materials that need to be synthesized at especially low process temperatures on the substrate surface to be coated in order to obtain the desired coating material properties as well the required coating quality. Also, in these cases the substrate temperature during process must be maintained under a limit temperature, above which the coating material cannot be synthesized exhibiting the necessary properties or required quality.

As just described above, the term low temperature coating process in the context of the present invention is related to the temperature that must be not exceeded during coating process in order to avoid damages of temperature sensitive substrates or of temperature sensitive coatings.

In the context of the present invention it is to be understood, that such low temperature coating processes are for example coating processes involving one or more of following steps:

Film deposition on plastic substrates or substrates comprising one or more plastic materials, e.g. PEEK, PC, ABS, PC/ABS.

Film deposition on steel substrates or substrates comprising one or more steel materials, which may not exceed temperature of 180° C. (e.g. 100Cr6).

Deposition of DLC films (e.g. of the type a-C:H or ta-C films), especially such DLC films that must be deposited at coating process temperatures not higher than 200° C. or even not higher than 180 C.

In this regard, one typical low temperature coating process involving two of the above-mentioned steps would be for example the deposition of a DLC film that requires a coating process temperature lower than 200° C. on a component made of a steel material having low recrystallization temperature.

Krassnitzer et al. propose in document WO02016116384A1 and in document WO2016116383A1 to provide protection shields in such a manner that an increment of heat dissipation from the interior of the coating chamber to the exterior can be attained. Arrangements of the protection shields according to the proposals in the above-mentioned documents are schematically shown in FIGS. 2 and 3, respectively.

In WO02016116384A1 it is proposed to regulate the heat dissipation from the interior of the chamber to the exterior by using a vacuum chamber, within which a shielding plate 30 is arranged between a chamber wall 20 and an area of the coating chamber destined for placed the substrates to be coated (hereafter this area will be also called coating area), wherein the shielding plate 30 comprises a first and a second side and is placed in such a manner that the first side is facing away from this area and is facing the inner chamber wall side, wherein this first side of the shielding plate is at least partially, preferably largely, provided with a first layer 31, which has an emissivity corresponding to $\epsilon \geq 0.65$ during coating process (see FIG. 2).

In WO2016116383A1 it is proposed to control the process temperature by providing a heat shield 30' in the interior of the coating chamber, wherein the heat shield 30' is arranged on a temperature controllable chamber wall 20', wherein the heat shield 30' comprises at least one exchangeable radiating shield 31', which is directly adjacent to an inner side of the chamber wall 20', and wherein a first radiating surface 311' of the radiating shield 31' that is directed towards the chamber wall 20' has a first predeterminable heat exchange coefficient $\epsilon D1$ and a second radiating surface 312' of the radiating shield 31' that is directed away from the chamber wall 20' has a second predeterminable heat exchange coefficient $\epsilon D2$, wherein the first exchange coefficient $\epsilon D1$ is greater than the second heat exchange coefficient $\epsilon D2$ (see FIG. 3).

The two proposals mentioned above can help to regulate increase heat dissipation from the interior of the coating chamber to the exterior, allowing in this manner the conduction of low temperature coating processes. However, there is still an increasing demand for higher efficiency in low temperature coating processes, especially in terms of film deposition rate.

In this regard He et al. propose in WO2000056127A1 a method for conducting low temperature coating processes, in particular a method for producing DLC by maintaining low substrate temperatures, wherein a radio frequency inductively coupled plasma source is used for film deposition and the substrate temperature is regulated by using a water cooled substrate holder, at which a bias voltage is applied by using a negative pulsed voltage signal. However, in the majority of the cases, the use of a cooled substrate holder as proposed by He et al., is not a suitable solution for batch coating systems in which a large rotating carousel is used as substrate holder.

OBJECTIVE OF THE PRESENT INVENTION

A main objective of the present invention is to provide a coating device, which allows to conduct low temperature coating processes without needing to use cooled substrate holders.

The coating device according to the present invention may preferably allow attaining a high efficiency in terms of increased deposition rates when low temperature coating processes are carried out.

DESCRIPTION OF THE PRESENT INVENTION

The objective of the present invention may be attained by providing an inventive coating device having an inventive arrangement which allows increasing heat dissipation from the interior of the coating chamber to the exterior in such a manner that high efficient low temperature coating processes can be conducted.

Figure 4:
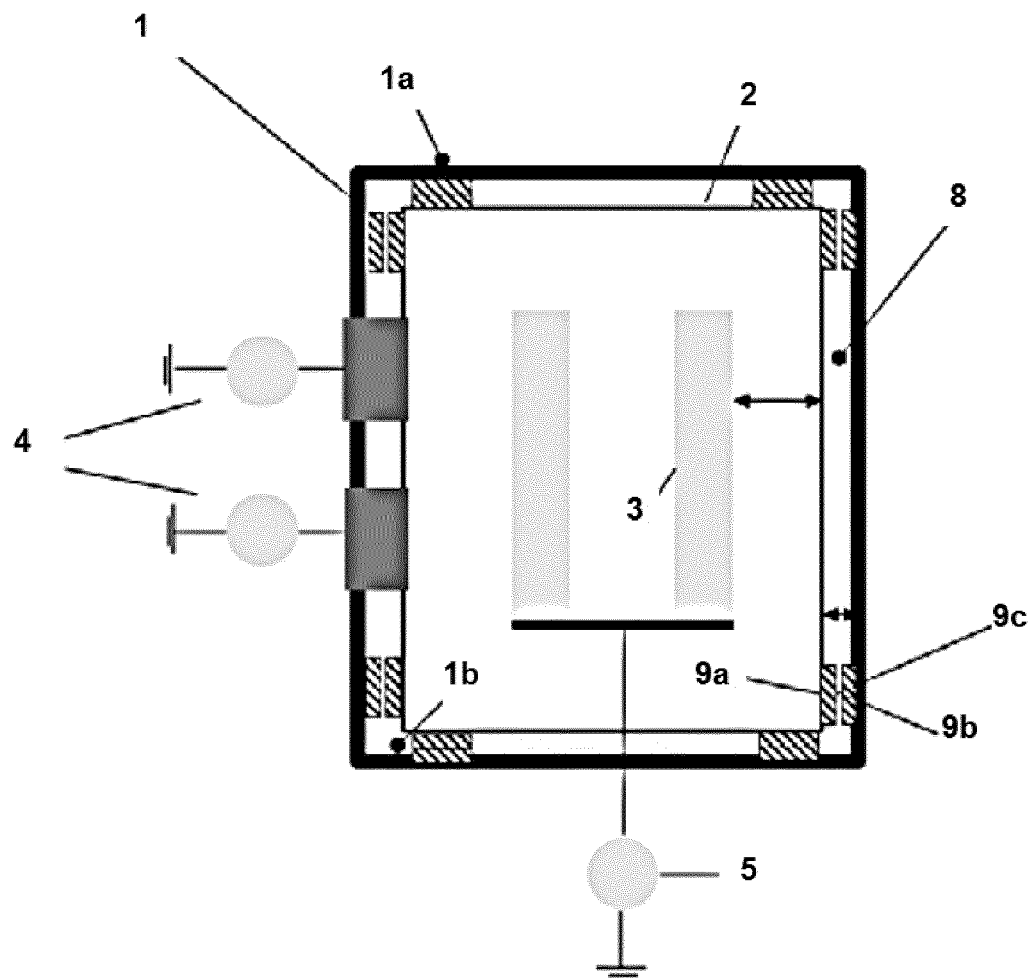
FIG. 4 is a schematic drawing of a vacuum coating chamber according to the invention.

The coating device according to the present invention comprises a vacuum coating chamber for conducting vacuum coating processes, which is schematically shown in FIG. 4, said vacuum coating chamber comprises:
- one or more cooled chamber walls 1 having an inner side 1b and a cooled side 1a,
- protection shields being arranged in the interior of the chamber as one or more removable shielding plates 2, which cover at least part of the surface of the inner side 1b of the one or more cooled chamber walls 1, wherein at least one removable shielding plate 2 is placed forming a gap 8 in relation to the surface of the inner side 1b of the cooled chamber wall 1 that is covered by said removable shielding plate 2,
wherein thermal conductive means 9 are arranged filling the gap 8 in an extension corresponding to at least a portion of the total surface of the inner side 1b of the cooled chamber wall 1 that is covered by said removable shielding plate 2, and wherein the thermal conductive means 9 enable conductive heat transfer between said removable shielding plate 2 and the respectively covered cooled chamber wall 1.

The gap can be for example in a range of approximately 5 mm to 20 mm, but it is not limited to this range.

According to one preferred embodiment of the present invention the thermal conductive means 9 comprise:
- at least one shielding elevated plane 9a arranged at a shielding contact surface A on the side of the shielding plate 2 that is facing the inner side 1b of the respectively covered cooled chamber wall 1a, and/or at least one wall elevated plane 9b arranged at a wall contact surface B on the inner side 1b of the respectively covered cooled chamber wall 1, and
- thermal bridge material 9c arranged filling the rest of the gap 8 between the shielding contact surface A and the wall contact surface B, that is not occupied with the shielding elevated plane 9a and/or with the wall elevated plane 9b, forming a thermal interface for conductive heat transfer between the shielding contact surface A and the wall contact surface B.

According to one further preferred embodiment of the present invention the thermal conductive means 9 comprise:
- at least one shielding elevated plane 9a arranged at a shielding contact surface A on the side of the shielding plate 2 that is facing the inner side 1b of the respectively covered cooled chamber wall 1a, and at least one wall elevated plane 9b arranged at a wall contact surface B on the inner side 1b of the respectively covered cooled chamber wall 1.

In this embodiment described directly above, the use of thermal bridge material 9c can be optional, when the at least one shielding elevated plane 9a and the at least one wall elevated plane 9b are arranged one in close contact to each other, forming a thermal interface for conductive heat transfer between the shielding contact surface A and the wall contact surface B, and allowing in this manner conductive heat transfer with or without thermal bridge material 9c.

According to one further preferred embodiment of the present invention the thermal bridge material 9c is provided as a carbon foil.

Preferably the carbon foil is a self-adhesive carbon foil.

For enabling high conductive heat transfer across the shielding plate surface and in particular across the shielding contact surface A that is in direct contact with the thermal conductive means 9 (the shielding elevated plane 9a or the thermal bridge material) is very important to select carefully the material and the thickness of the shielding plates.

In this regard the inventors propose that the shielding plates 2 and the elevated planes 9a and 9b are made of a high thermally conductive material and have an adequate thickness in order to possess good cross thermal conductivity.

According to one preferred embodiment of the present invention, the shielding plates 2 and the elevated planes 9a and 9b are made of a thermally conductive material having heat conductivity of more than 100 W/mK.

In the context of the present invention, very good conduction as heat transfer was attained by using shielding plates 2 and elevated planes 9a and 9b made of aluminum alloys.

One further material that is a very suitable high thermally conductive material for making shielding plates and elevated planes 9a and 9b in the context of the present invention is aluminum.

The thickness of the shielding plates 2 and the thickness of the shielding elevated planes 9a can be for example and 9b is between 3 mm and 12 mm, more preferably between 6 mm and 10 mm.

The above-mentioned thickness range is however a suggested range and is not a limitation of the present invention.

The shielding elevated planes can be designed as being part of the shielding plates. In such a case the thickness of the shielding plates can be selected to be for example about 9 mm and the contact areas of the shielding plates can be designed as shielding elevated planes having a further thickness of 3 mm.

The wall elevated planes can be also designed as being a part of the cooled vacuum chamber walls.

The shielding plates with shielding elevated planes 9a can be provided as segments, so that each segment can be provided covering a surface of the cooled chamber wall.

In this manner it is possible to increase and to optimize the heat transfer via conduction through selected contact surface areas of the cooled chamber walls via a plurality of heat conducting interfaces.

A preferred cooling fluid that can be used for cooling the chamber walls according to the present invention is for example cold water, which should have for example a temperature that is higher than the dew point of the ambient air.

According to a preferred embodiment of the present invention one or more heat conducting interfaces comprise apart from thermal bridge material 9c, both a shielding elevated plane 9a and a wall elevated plane 9b.

In order to facilitate maintenance, the shielding elevated plane 9a and the shielding elevated plane 9b can be designed as counterparts, which can be brought together in close contact by a clamp mechanism, so that each counterpart can be clamped to the corresponding counterpart. In order to improve the thermal conductivity, thermal bridge material 9c should be provided between the two counterparts. In this case but also in other cases the thermal bridge material 9c can be a self-adhesive carbon foil. This self-adhesive carbon foil can be for example a self-adhesive carbon foil from the type KU-CB1205-AV produced by the company Kunze.

The clamp mechanism can for example be made of a fast lock with one or more release screws. In this manner the elevated planes 9a and 9b can be declamped and the shielding plates can be removed in a very easy manner for allowing periodically sandblasting and cleaning.

Figure 5A:
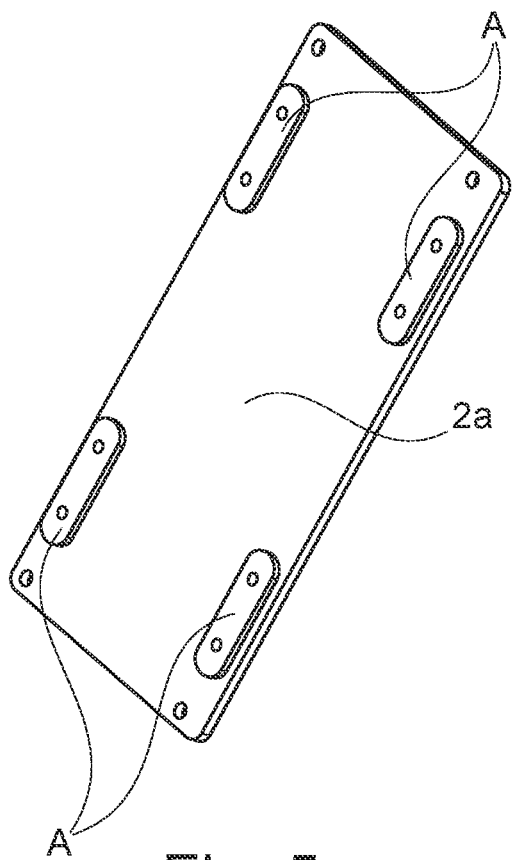
FIGS. 5a, 5b, and 5c are schematic drawings of shielding plates that can be used in a vacuum coating chamber according to the invention.
Figure 5B:
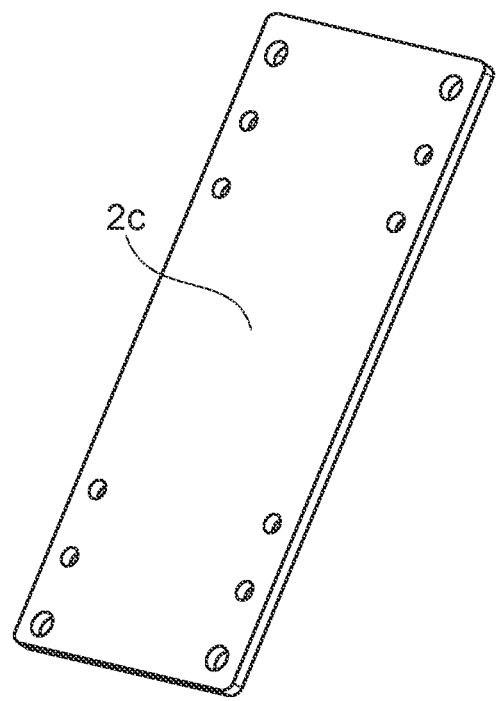

FIG. 5 shows two examples of shielding plates that can be used in a vacuum coating chamber according to the present invention. The shielding plate schematically shown in FIG. 5a and FIG. 5b can for example be used for covering a cooled chamber wall at which no coating sources or heating elements are arranged. FIG. 5a shows the rear side 2a and FIG. 5b shows the front side 2c of the shielding plate which need to be subjected to maintenance.

Figure 5C:
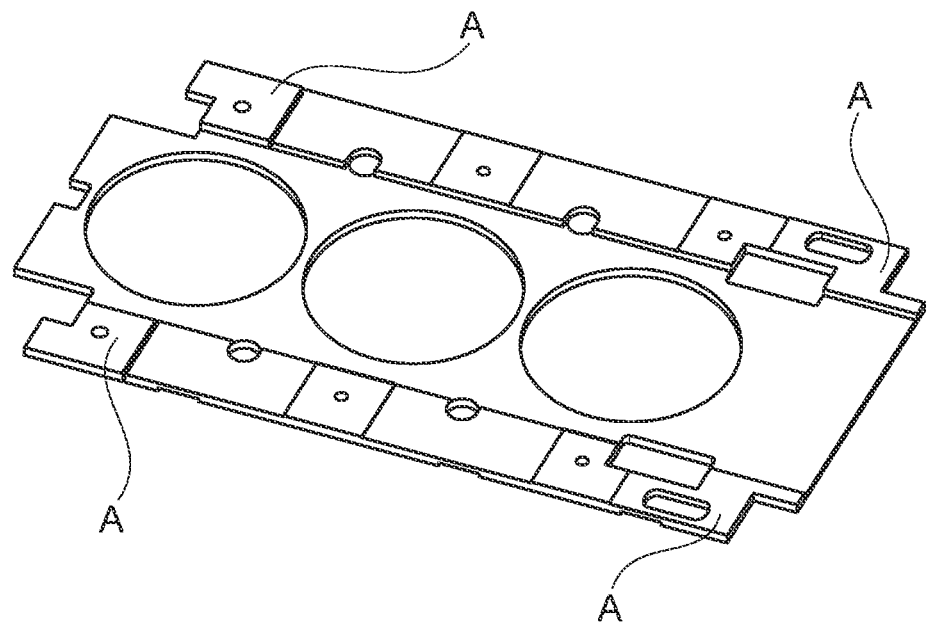

In contrast, the shielding plate schematically shown in FIG. 5c can be used for example for covering a cooled chamber wall at which three circular components are arranged. FIG. 5c shows the rear side 2a of the shielding plate.

The shielding elevated planes 9a are to be provided at the rear side 2a of the shielding plates that is facing towards the inner side 1b of the chamber walls, as already mentioned above.

As a showcase, contact surfaces A of the shielding plates are shown in FIG. 5. In this example these contact surfaces A are designed as shielding elevated planes 9a and are part of the shielding plate.

However, it is also possible to mount the elevated planes 9a at the contact surfaces A separately.

The coating device according to the present invention makes possible indirect cooling of substrates to be coated and allows in this manner to maintain low process temperatures i.e. low substrate temperatures during coating of temperature sensitive substrate materials.

This invention allows furthermore conducting coating processes, in which temperature sensitive coatings can be synthesized at high deposition rates.

This is attained according to the present invention by increasing the net radiative heat flux from the substrates to be coated to the protective shields by providing the protective shields as shielding plates in such a manner that they act as heat sinks.

The inventors have attained that the shielding plates act as heat sinks by providing heat conductivity means 9 between the shielding plates and the cooled chamber walls, in such a manner that the thermal conductive means allow efficient conductive thermal exchange between the shielding plates and the cooled chamber walls.

One preferred manner of allowing conductive thermal exchange between the shielding plates and the cooled chamber walls involves providing contact areas between the protective shields and the cooled chamber walls. Preferably the heat conductivity means are designed comprising the above-mentioned contact areas and allowing detachable clamping of the protective shields to the cooled chamber walls.

With the term "detachable clamping" in the context of the present invention it is in particular meant that areas of the protective shields that are considered a first counterpart and areas of the chamber walls that are considered as the second counterpart are provided with clamping means that allow temporarily clamping of the protective shields on the respective chamber walls, wherein during clamping the first and the second counterparts are brought together in close contact, which allows that the first and second counterparts can be thermally connected. The use of thermal bridge material is not indispensable but can help to improve heat transfer via conduction, in particular by using a self-adhesive carbon foil as thermal bridge material.

In order to attain a relevant increment of radiative heat flux from the substrates to be coated to the protective shields according to the present invention, it is furthermore recommendable that the protective shields that should act as heat sink cover more than 50% of the surfaces of the inner side 1b of the cooled chamber walls 1.

The inventors carried out several experiments with the coating device according to the present invention and determine that the inventive coating device is best suitable for conducting low temperature coating processes, in which the substrate temperature needs to be maintained in a range of 50° C. to 250° C.

In particular, the inventors conducted low temperature coating processes, in which DLC and ta-C films were deposited on substrates, whose temperature was maintained in a temperature range of 80° C. to 180° C.

However, the use of a coating device according to the present invention is not limited to coating processes in which a substrate temperature of 250° C. should not be exceeded.

A coating device according to the present invention is in particular suitable for conducting coating processes, in which:
- a substrate temperature of 300° C. should not be exceeded,
- for depositing DLC films by using PECVD technologies,
- for depositing ta-C films by using PVD ARC technologies,
- for depositing MoN films by using PVD ARC technologies,
- for depositing hard carbon films by using magnetron sputtering or HiPIMS or similar technologies.

Figure 1:
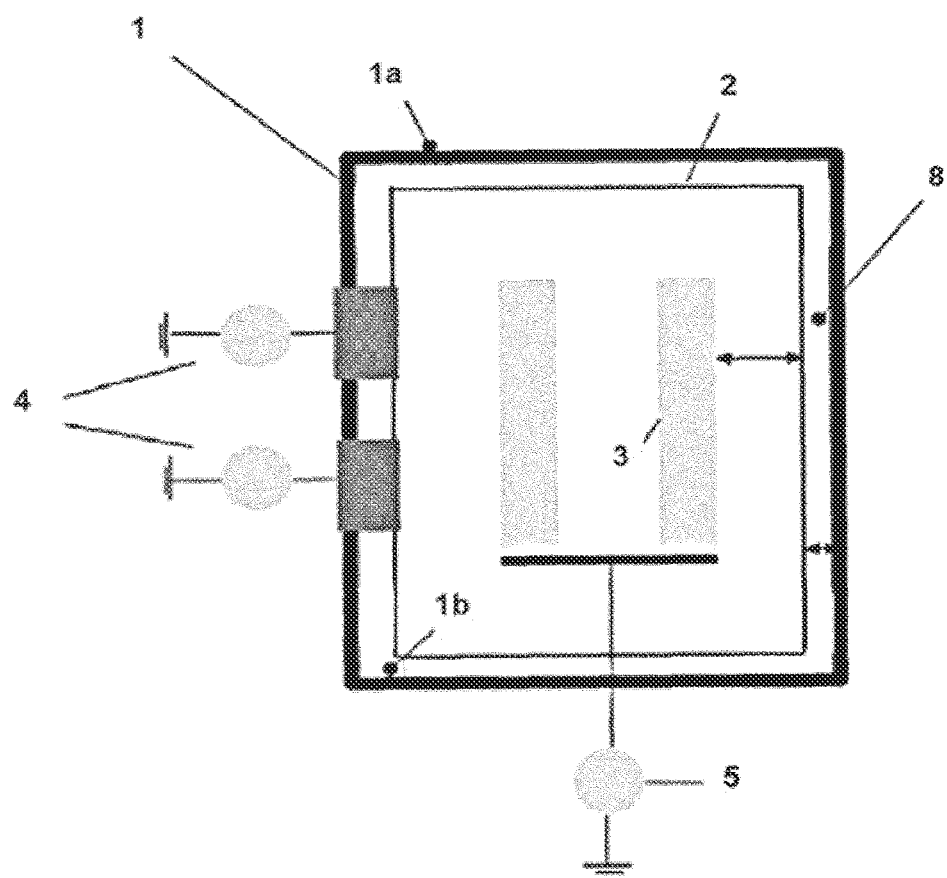
FIG. 1 is a diagram of a conventional vacuum chamber.
Figure 2:
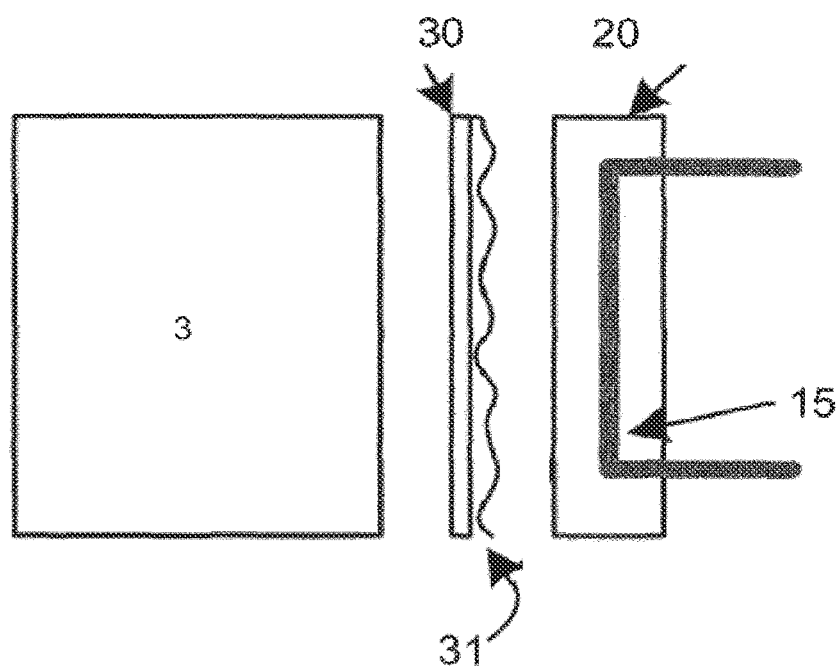
FIG. 2 is a schematic drawing of one example of a protection shield.
Figure 3:
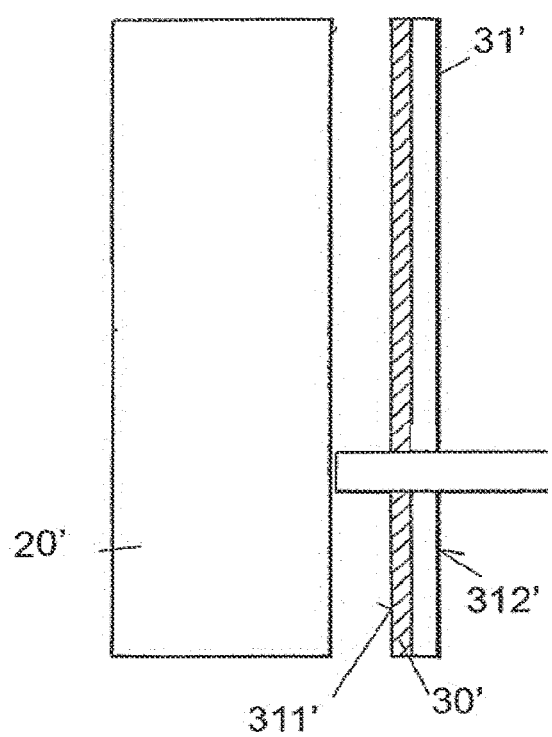
FIG. 3 is a schematic drawing of another example of a protection shield.

The technological advantage of using a coating device according to the present invention will be explained in more detail by comparing the results attained by using a coating device according to the state of the art, like this shown in FIG. 1 and the results attained by using a coating device according to the present invention, like this shown in FIG. 2. Both coating devices have a vacuum chamber size of Ø650 mm×700 mm.

EXAMPLE 1

In this example the inventors compare heat transfer simulations of coating processes conducted by using thermal conductive means according to the present invention and without using thermal conductive means.

The simulation predicts what kind of input powers give a substrate temperature of 150° C. as a function of the different cooling conditions.

The increase in film deposition rate corresponds to the increase in coating source power. The results of the comparison are shown below in Table 1:

TABLE 1

| Coating device | Cooling water temperature [° C.] | Power provided by coating source [W] | Power provided by bias voltage [W] | Total Power entering to the vacuum chamber | Substrate temperature [° C.] | Relative deposition rate of the DLC film [arb. Units] |
|---|---|---|---|---|---|---|
| State of the art | 40 | 528 | 211 | 739 | 150 | 1 |
| State of the art | 20 | 579 | 231 | 810 | 150 | 1.10 |
| Inventive | 40 | 696 | 278 | 974 | 150 | 1.32 |
| Inventive | 20 | 780 | 312 | 1092 | 150 | 1.48 |

EXAMPLE 2

In this example the first experiment was conducted in a coating device according to the state of the art, which does not comprise thermal conductive means according to the present invention. The second experiment was conducted in a coating device comprising thermal conductive means according to the present invention. In both cases DLC films were deposited by using the same HiPIMS technology.

The temperature of the cooling water was kept of 40° C. and its flow was kept constant for the two experiments. The power entering in the vacuum chamber by means of the coating sources and of the bias voltage was increased for conducting the second experiment. All further coating parameters were kept constant.

The inventors found surprisingly that not only a lower substrate temperature, but also a considerably high increment of the deposition rate was attained by using the coating device according to the present invention in comparison with the state of the art, as it is shown below in Table 2.

TABLE 2

| Coating device | Temperature of cooling water [° C.] | Power provided by plasma sources [W] | Power provided by bias voltage [W] | Shielding plates temperature [° C.] | Substrate temperature [° C.] | Relative deposition rate of the DLC film [arb. Units] |
|---|---|---|---|---|---|---|
| State of the art | 40 | 10.7 | 220 | 102 | 175 | 1 |
| Inventive | 40 | 15 | 320 | 76 | 159 | 1.35 |

EXAMPLE 3

Also in this example the first experiment was conducted in a coating device according to the state of the art, which does not comprise thermal conductive means according to the present invention. The second experiment was conducted in a coating device comprising thermal conductive means according to the present invention.

In both cases CrN films were deposited by using the same HiPIMS technology.

The temperature of the cooling water was kept of 40° C. and its flow was kept constant for the two experiments. All further coating parameters were kept constant.

The inventors found in this example that surprisingly by using the coating device according to the present invention a considerable reduction of substrate temperature was attained without affecting deposition rate, as it is shown below in Table 3.

TABLE 3

| Coating device | Temperature of cooling water [° C.] | Power provided by plasma sources [W] | Power provided by bias voltage [W] | Shielding plates temperature [° C.] | Substrate temperature [° C.] | Relative deposition rate of the CrN film [arb. Units] |
|---|---|---|---|---|---|---|
| State of the art | 40 | 13.5 | 160 | 110 | 230 | 1 |
| Inventive | 40 | 13.5 | 160 | 73 | 160 | 1 |

Further possible variants of the invention are described in the following paragraphs.

The coating device preferably comprises a vacuum coating chamber for conducting vacuum coating processes, said vacuum coating chamber comprising:
  one or more cooled chamber walls 1 having an inner side 1b and a cooled side 1a, protection shields being arranged in the interior of the chamber as one or more removable shielding plates 2, which cover at least part of the surface of the inner side 1b of the one or more cooled chamber walls 1, wherein at least one removable shielding plate 2 is placed forming a gap 8 in relation to the surface of the inner side 1b of the cooled chamber wall 1 that is covered by said removable shielding plate 2, wherein the thermal conductive means 9 are arranged filling the gap 8 in an extension corresponding to at least a portion of the total surface of the inner side 1b of the cooled chamber wall 1 that is covered by said removable shielding plate 2, wherein the thermal conductive means 9 enable conductive heat transfer between said removable shielding plate 2 and the respectively covered cooled chamber wall 1.

The coating device preferably comprises a vacuum coating chamber for conducting vacuum coating processes, said vacuum coating chamber comprising lateral chamber walls, protection shields arranged in the interior of the chamber and one or more coating sources arranged at one of the lateral chamber walls, wherein:

one or more of the lateral walls are cooled chamber walls 1 having an inner side 1b and a cooled side 1a, one or more of the protection shields are arranged as removable shielding plates 2 covering at least part of the surface of the inner side 1b of one of the cooled lateral chamber walls 1 at which one or more coating sources are arranged, wherein at least one of the removable shielding plates 2 is placed forming a gap 8 in relation to the surface of the inner side 1b of the cooled lateral chamber wall 1 that is being covered by said removable shielding plate 2, wherein the thermal conductive means 9 are arranged filling the gap 8 in an extension corresponding to at least a portion of the total surface of the inner side 1b of the cooled lateral chamber wall 1 that is being covered by the at least one removable shielding plate 2, wherein the thermal conductive means 9 enable conductive heat transfer between the at least one removable shielding plate 2 and the respectively covered part of the cooled lateral chamber wall 1.

Preferably the one or more coating sources 4 are attached to the lateral chamber wall 1. Preferably the substrates 3 to be coated are positioned parallel to the chamber wall 1. Beside lateral chamber walls 1, the coating chamber preferably comprises chamber walls 1 on the top and on the bottom. In a commonly installed coating chamber, in the sense of the invention, lateral can also be understood as vertical. In this sense, the lateral walls are correspondingly orthogonal to the horizontal.

Preferably both the at least one removable shielding plate 2 and the respectively covered part of the cooled lateral chamber wall 1 comprise contact areas provided with thermal conductive means designed as counterparts, the counterparts comprising clamping means for allowing temporarily clamping of the counterparts, wherein the counterparts are thermally connected during the temporarily clamping of the counterparts.

Preferably the thermal conductive means 9 comprise:

at least one shielding elevated plane 9a arranged at a shielding contact surface A on the side of the shielding plate 2 that is facing the inner side 1b of the respectively covered cooled chamber wall 1a, and/or at least one wall elevated plane 9b arranged at a wall contact surface B on the inner side 1b of the respectively covered cooled chamber wall 1.

Preferably the thermal conductive means 9 comprise:

thermal bridge material 9c arranged filling the rest of the gap 8 between the shielding contact surface A and the wall contact surface B, that is not occupied with the shielding elevated plane 9a and/or with the wall elevated plane 9b, forming a thermal interface for conductive heat transfer between the shielding contact surface A and the wall contact surface B.

Preferably the thermal conductive means 9 comprise:

at least one shielding elevated plane 9a and at least one wall elevated plane 9b arranged one in front of each other in close contact forming a thermal interface that enables conductive heat transfer between said removable shielding plate 2 and the respectively covered cooled chamber wall 1.

Preferably the thermal conductive means 9 comprise:

thermal bridge material 9c arranged at the contact surface between the at least one shielding elevated plane 9a and the at least one wall elevated plane 9b that are arranged in close contact forming a thermal interface.

Preferably the thermal bridge material 9c is a carbon foil.

Preferably the carbon foil is a self-adhesive carbon foil.

Preferably the shielding elevated planes 9a are part of the shielding plates 2 and/or the wall elevated planes 9b are part of the cooled chamber wall 1.

Preferably the gap 8 is in a range of approximately about 5 mm to about 20 mm.

Preferably the thickness of the shielding plates 2 and the thickness of the shielding elevated planes 9a and 9b is between about 3 mm and about 12 mm, preferably between 6 mm and 10 mm.

Preferably the shielding elevated planes 9a, 9b can be designed as being part of the shielding plates.

Preferably the thickness of the shielding plates is about 9 mm. Preferably the contact areas of the shielding plates 2 is designed as shielding elevated planes 9a, 9b having a further thickness of about 3 mm.

Preferably the shielding plates with shielding elevated planes 9a can be provided as segments, so that each segment can be provided covering a surface of the cooled chamber wall.

Preferably a cooling fluid is used for cooling the chamber walls. Preferably the cooling fluid is water. Preferably the water temperature is higher than the dew point of the ambient air.

Preferably the shielding elevated planes are a part of the cooled vacuum chamber walls 1.

Preferably the shielding elevated planes 9a, 9b are located close to the edge of the shielding plates 2. In this case, the thermal cooling is quite high. Additionally the bending of the shielding plates 2 due to thermal stresses is reduced.

Preferably at least one removable shielding plate 2 is arranged on each cooled chamber wall 1.

Preferably each chamber wall 1 is cooled.

Method preferably comprises a step in which at least a substrate is coated, characterized in that the coating process is conducted in a device according to any of the preceding paragraphs.

Preferably the substrate to be coated is maintained at a temperature not higher than 200° C. during coating process.

The invention claimed is:

1. A coating device comprising a vacuum coating chamber for conducting vacuum coating processes, said vacuum coating chamber comprising:

one or more cooled chamber walls having an inner side and a cooled side;

one or more protection shields arranged in an interior of the chamber as one or more removable shielding plates, which cover at least part of a surface of the inner side of the one or more cooled chamber walls, wherein at least one of the removable shielding plates is placed forming a gap in relation to the surface of the inner side of the cooled chamber wall that is covered by said at least one removable shielding plate; and thermal conductive means arranged filling the gap in an extension corresponding to at least a portion of a total surface of the inner side of the cooled chamber wall that is covered by said at least one removable shielding plate, wherein the thermal conductive means enable conductive heat transfer between said at least one removable shielding plate and the respectively covered cooled chamber wall, the thermal conductive means comprising:

at least one shielding elevated plane arranged at a shielding contact surface on a side of the shielding plate that is facing the inner side of the respectively covered cooled chamber wall, and/or at least one wall elevated plane arranged at a wall contact surface on the inner side of the respectively covered cooled chamber wall; and a thermal bridge material filling a remainder of the gap between the shielding contact surface and the wall contact surface, that is not occupied with the shielding elevated plane and/or with the wall elevated plane, forming a thermal interface for conductive heat transfer between the shielding contact surface and the wall contact surface, wherein the thermal bridge material is a carbon foil.

2. A coating device comprising a vacuum coating chamber for conducting vacuum coating processes, said vacuum coating chamber comprising:

one or more lateral chamber walls;

one or more protection shields arranged in an interior of the chamber; and one or more coating sources arranged at one of the lateral chamber walls, wherein:

one or more of the lateral walls are cooled chamber walls having an inner side and a cooled side, one or more of the protection shields are arranged as removable shielding plates covering at least part of a surface of the inner side of one of the cooled lateral chamber walls at which one or more coating sources are arranged, wherein at least one of the removable shielding plates is placed forming a gap in relation to the surface of the inner side of the cooled lateral chamber wall that is being covered by said one or more removable shielding plates, wherein thermal conductive means are arranged filling the gap in an extension corresponding to at least a portion of a total surface of the inner side of the cooled lateral chamber wall that is being covered by the at least one removable shielding plate, wherein the thermal conductive means enable conductive heat transfer between the at least one removable shielding plate and the respectively covered part of the cooled lateral chamber wall, the thermal conductive means comprising:

at least one shielding elevated plane arranged at a shielding contact surface on a side of the shielding plate that is facing the inner side of the respectively covered cooled chamber wall, and/or at least one wall elevated plane arranged at a wall contact surface on the inner side of the respectively covered cooled chamber wall; and a thermal bridge material filling a remainder of the gap between the shielding contact surface and the wall contact surface, that is not occupied with the shielding elevated plane and/or with the wall elevated plane, forming a thermal interface for conductive heat transfer between the shielding contact surface and the wall contact surface, wherein the thermal bridge material is a carbon foil.

3. The coating device according to claim 2, wherein both the at least one removable shielding plate and the respectively covered part of the cooled lateral chamber wall comprise contact areas provided with thermal conductive means designed as counterparts, the counterparts comprising clamping means for allowing temporary clamping of the counterparts, wherein the counterparts are thermally connected during the temporary clamping of the counterparts.

4. The coating device according to claim 2, wherein the thermal conductive means comprise:

at least one shielding elevated plane and at least one wall elevated plane arranged one in front of each other in close contact forming a thermal interface that enables conductive heat transfer between said removable shielding plate and the respectively covered cooled chamber wall.

5. The coating device according to claim 4, wherein the thermal conductive means comprise:

a thermal bridge material arranged at a contact surface between the at least one shielding elevated plane and the at least one wall elevated plane that are arranged in close contact forming a thermal interface.

6. The coating device according to claim 2, wherein the carbon foil is a self-adhesive carbon foil.

7. The coating device according to claim 2, wherein the shielding elevated planes are part of the shielding plates and/or the wall elevated planes are part of the cooled chamber wall.

8. The coating device according to claim 2, wherein the shielding elevated planes are designed as being part of the shielding plates.

9. The coating device according to claim 2, wherein a cooling fluid is used for cooling the chamber walls.

10. The coating device according to claim 2, wherein the gap is in a range of approximately about 5 mm to about 20 mm.

11. A method comprising a step in which at least a substrate is coated, wherein the coating process is conducted in a device according to claim 2.

12. The method according to claim 11, comprising maintaining the substrate to be coated at a temperature not higher than 200° C. during the coating process.

13. The coating device according to claim 5, wherein the thermal bridge material is a carbon foil.

14. The coating device according to claim 13, wherein the carbon foil is a self-adhesive carbon foil.

15. The coating device according to claim 4, wherein the shielding elevated planes are part of the shielding plates and/or the wall elevated planes are part of the cooled chamber wall.

16. The coating device according to claim 4, wherein the shielding elevated planes are designed as being part of the shielding plates.

* * * * *